US010116052B2

United States Patent
Nezhad-Ahmadi et al.

(10) Patent No.: US 10,116,052 B2
(45) Date of Patent: Oct. 30, 2018

(54) TUNABLE ANTENNA FOR HIGH-EFFICIENCY, WIDEBAND FREQUENCY COVERAGE

(71) Applicant: SEMICONDUCTOR COMPONENTS INDUSTRIES, LLC, Phoenix, AZ (US)

(72) Inventors: Mohammad-Reza Nezhad-Ahmadi, Waterloo (CA); Andrew Kuikman, Kitchener (CA)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 13 days.

(21) Appl. No.: 15/161,120

(22) Filed: May 20, 2016

(65) Prior Publication Data

US 2017/0141753 A1 May 18, 2017

Related U.S. Application Data

(60) Provisional application No. 62/255,617, filed on Nov. 16, 2015.

(51) Int. Cl.
*H01Q 5/321* (2015.01)
*H01Q 5/392* (2015.01)
*H01Q 5/371* (2015.01)
*H01Q 5/328* (2015.01)
*H01Q 5/385* (2015.01)
*H01Q 9/42* (2006.01)
*H01Q 1/24* (2006.01)
*H03H 7/38* (2006.01)

(52) U.S. Cl.
CPC ............ *H01Q 5/321* (2015.01); *H01Q 1/243* (2013.01); *H01Q 5/328* (2015.01); *H01Q 5/371* (2015.01); *H01Q 5/385* (2015.01); *H01Q 5/392* (2015.01); *H01Q 9/42* (2013.01); *H03H 7/38* (2013.01)

(58) Field of Classification Search
CPC ........ H01Q 1/243; H01Q 5/314; H01Q 5/321; H01Q 5/328; H01Q 5/364; H01Q 5/371; H01Q 5/378; H01Q 5/385; H01Q 5/392; H01Q 7/005; H01Q 9/42
See application file for complete search history.

(56) References Cited

U.S. PATENT DOCUMENTS

| | | | |
|---|---|---|---|
| 2004/0009754 A1 | 1/2004 | Smith, Jr. | |
| 2007/0285326 A1* | 12/2007 | McKinzie | H01Q 9/0407 343/746 |
| 2009/0224991 A1* | 9/2009 | Rowson | H01Q 1/243 343/747 |
| 2011/0032165 A1* | 2/2011 | Heng | H01Q 7/005 343/745 |
| 2013/0295863 A1 | 11/2013 | Shanan | |

* cited by examiner

*Primary Examiner* — Robert Karacsony
(74) *Attorney, Agent, or Firm* — Dickinson Wright PLLC

(57) ABSTRACT

A system, in some embodiments, comprises: a processor; a transceiver coupled to the processor; and an antenna including a central element that connects to one or more of the processor and the transceiver, said antenna further including multiple coupling elements that electromagnetically couple to the central element, wherein each of the multiple coupling elements comprises a separate variable capacitor.

23 Claims, 5 Drawing Sheets

TUNABLE ANTENNA FOR HIGH-EFFICIENCY, WIDEBAND FREQUENCY COVERAGE

CROSS-REFERENCE TO RELATED APPLICATION

This application claims priority to U.S. Provisional Application No. 62/255,617, filed on Nov. 16, 2015, entitled "TUNABLE ANTENNA FOR HIGH-EFFICIENCY, WIDEBAND FREQUENCY COVERAGE," invented by Mohammad-Reza NEZHAD-AHMADI and Andrew KUIK-MAN, and is incorporated herein by reference and priority thereto for common subject matter is hereby claimed.

BACKGROUND

Many wireless devices are designed to operate in multiple frequency bands, thus increasing the versatility of such devices in different operating environments. For example, some so-called multi-band cell phones can operate in the 700-960 MHz, 1700-220 MHz and 2500-2700 MHz frequency bands, making such phones well-suited for travel between countries in which different communication standards are used. Wireless medical devices also may operate in different bands (e.g., 400 MHz, 900 MHz and 2.4 GHz bands). One drawback to such devices, however, is that an increased number of frequency bands causes impedance mismatches that ultimately result in poorer operational efficiency within each of those frequency bands. Compounding such inefficiency is the reduced power transfer that occurs between transceivers and antennas when antenna impedance varies due to environmental changes (e.g., by holding a cell phone near the head, by mounting a wireless medical device on or near a human body).

SUMMARY

At least some of the embodiments disclosed herein are directed to a system, comprising: a processor; a transceiver coupled to the processor; and an antenna including a central element that connects to one or more of the processor and the transceiver, said antenna further including multiple coupling elements that electromagnetically couple to the central element, wherein each of the multiple coupling elements comprises a separate variable capacitor. These embodiments may be supplemented using one or more of the following concepts, in any order and in any combination: wherein a change in the capacitances of the variable capacitors causes a shift in the frequencies at which the system operates most efficiently; wherein at least one of the multiple coupling elements comprises a ground connection positioned within one centimeter of at least one of said variable capacitors; wherein said separate variable capacitors are controlled by control signals supplied by the processor; wherein a capacitance range of at least one of said variable capacitors is 2.05 pico Farads to 8.2 pico Farads; wherein a control signal applied to at least one of said variable capacitors is determined based on a target operating frequency for the system; further comprising a data structure that cross-references multiple possible target operating frequencies for the system with multiple possible control signals that can be applied to one or more of the variable capacitors; wherein a control signal applied to at least one of said variable capacitors is determined based on a mismatch between an antenna impedance and an impedance associated with said transceiver; wherein said mismatch is detected using one or more sensors that sense environmental or positional changes associated with the system; wherein the processor uses a data structure that cross-references possible data from said one or more sensors with possible control signals that can be applied to the separate variable capacitors; further comprising a closed loop tuning module that detects said mismatch, wherein the processor uses data from the closed loop tuning module to determine said control signal to correct said mismatch; wherein the multiple coupling elements do not directly connect with the central element or with each other; wherein each of the multiple coupling elements comprises multiple variable capacitors.

At least some embodiments are directed to an antenna, comprising: a central element that receives signals from and provides signals to a transceiver; multiple coupling elements that electromagnetically couple with the central element; and multiple variable capacitors, each of said capacitors positioned on a different one of the multiple coupling elements. These embodiments may be supplemented using one or more of the following concepts, in any order and in any combination: wherein each of the multiple coupling elements has a ground connection, and wherein each of said ground connections is positioned between one millimeter and one centimeter away from the variable capacitor on that coupling element; wherein the multiple coupling elements do not connect directly with the central element; wherein the multiple coupling elements are separated from each other at all points by a minimum distance that ranges from one millimeter to one centimeter, inclusive.

At least some embodiments are directed to a method, comprising: determining multiple target operating frequencies in an antenna; identifying, based on the multiple target operating frequencies, control signals to apply to multiple variable capacitors built into coupling elements of said antenna; and applying the control signals to the multiple variable capacitors so that said multiple target operating frequencies are the frequencies at which the antenna operates most efficiently. These embodiments may be supplemented using one or more of the following concepts, in any order and in any combination: further comprising using data structures that cross-reference multiple possible target operating frequencies with multiple possible control signals to identify said control signals to apply to the multiple variable capacitors; further comprising applying said control signals to the multiple variable capacitors so that said frequencies at which the antenna operates most efficiently form a continuous frequency band.

Figure 1:
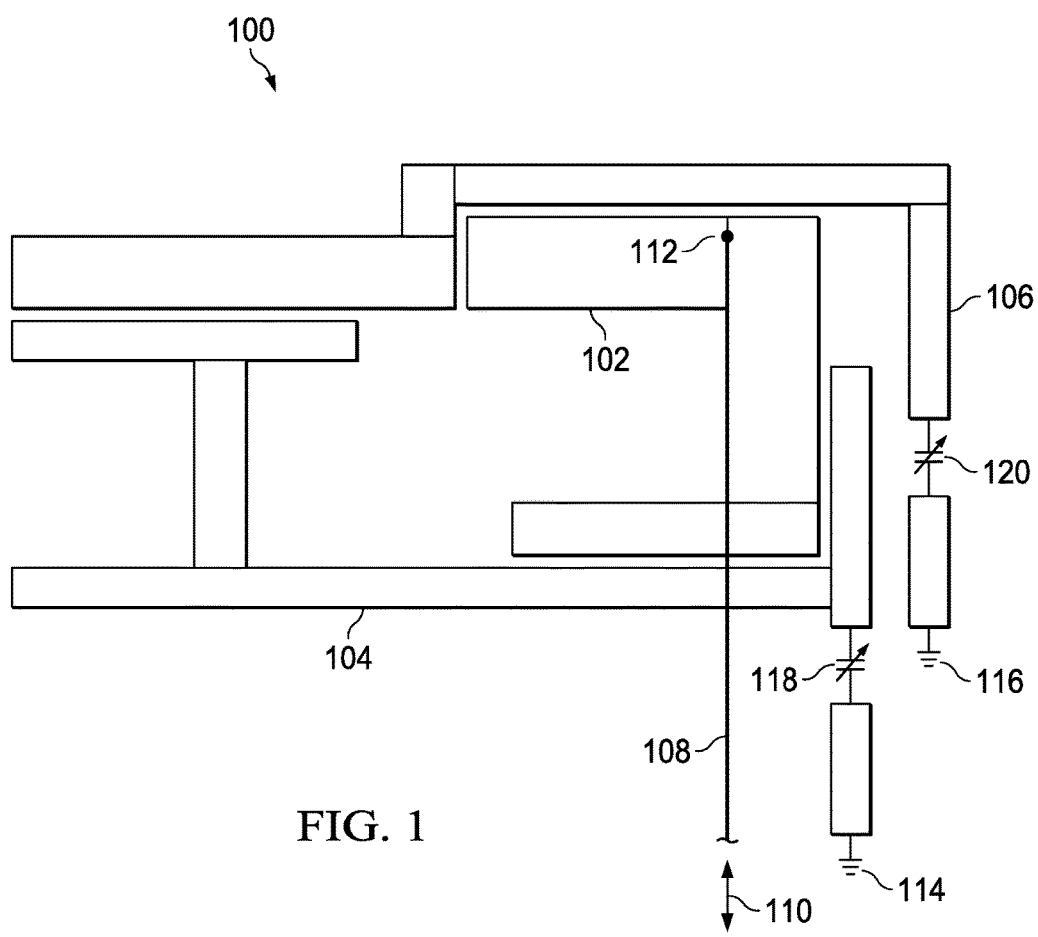
FIG. 1 is a block diagram of a dual resonance antenna in accordance with embodiments of the invention.

It should be understood, however, that the specific embodiments given in the drawings and detailed description thereto do not limit the disclosure. On the contrary, they provide the foundation for one of ordinary skill to discern the alternative forms, equivalents, and modifications that are encompassed together with one or more of the given embodiments in the scope of the appended claims.

DETAILED DESCRIPTION

Disclosed herein is a wireless communication system that can dynamically adjust the frequencies at which it operates most efficiently and that can dynamically adapt to changes in antenna impedance. The system includes an antenna that has a central element that is electromagnetically coupled to multiple coupling elements, and each such coupling element contains a variable capacitor. The variable capacitor can be adjusted to dynamically ensure that the antenna impedance and the transceiver impedance match, regardless of environmental or positional changes that may be affecting antenna impedance and irrespective of the frequencies at which the system is operating.

FIG. 1 is a block diagram of an illustrative dual resonance antenna 100 in accordance with embodiments of the invention. The antenna 100 includes a central element 102 and coupling elements 104 and 106 to which the central element 102 electromagnetically couples. In at least some embodiments, the central element 102 does not directly connect to one or more of the coupling elements 104 and 106, and in some embodiments, the coupling elements 104 and 106 do not directly connect to each other. In at least some embodiments, the coupling elements 104 and 106 are separated from each other at all points by a minimum distance ranging between one millimeter and one centimeter, inclusive. The central element 102 connects to a micro-coaxial ("microcoax") cable 108 that transfers signals 110 to and from the central element 102 via a feed point 112. As explained below, the signals 110 are provided to and from, e.g., a transceiver or processor. The central element 102 and coupling elements 104 and 106 may be formed as desired using well-known techniques and with specific geometries that accomplish specific design objectives. The coupling element 104 has a ground connection 114 and the coupling element 106 has a ground connection 116. In at least some embodiments, the ground connections 114, 116 for the coupling elements 104, 106 are through the variable capacitors—i.e., in these embodiments, the coupling elements 104, 106 do not directly connect to the ground connections 114, 116. The coupling elements 104 and 106 contain variable capacitors 118, 120, respectively. In at least some embodiments, the variable capacitors 118 and 120 are positioned close to the ground connections 114, 116. For instance, the distance between the ground connection 114 and the variable capacitor 118 may range between one millimeter and one centimeter. The scope of disclosure, however, is not limited to this or any other particular placement of the variable capacitors 118, 120, so long as the variable capacitors 118, 120 are directly connected with the coupling elements 104, 106.

The variable capacitors 118, 120 may be any type of device whose capacitance varies based on some type of control signal. For example, the variable capacitors may vary according to the voltage applied to the capacitors. Although the specific capacitance ranges chosen for the variable capacitors 118, 120 may vary based on the overall design of the antenna 100 and specific performance objectives, in at least some embodiments, the capacitance range is between 2.05 pico Farads to 8.2 pico Farads, inclusive. The variable capacitors 118, 120 preferably, but not necessarily, are barium strontium titanate (BST) capacitors. Furthermore, they are preferably, but not necessarily, analog capacitors, since analog capacitors provide greater granularity than digital capacitors.

In an illustrative, non-limiting operation, the central element 102 receives a signal 110 (e.g., from a transceiver) via feed point 112. The central element 102 radiates the signal, and the energy of the radiated signal is at least partially absorbed by the coupling elements 104, 106. The coupling elements 104, 106, in turn, radiate the absorbed energy. During operation—for instance, when a user holds the electronic device containing the antenna 100 near the body or metallic objects or when the position of the electronic device is rotated—the impedance of the antenna 100 may change. This change in impedance causes a mismatch between the antenna impedance and the impedance of the transceiver to which the antenna connects. Such impedance mismatches may decrease the operating efficiency of the antenna 100 in the desired frequency band. In such instances, components—such as that described in detail with respect to FIG. 4, below—detect the shift in antenna impedance and alter the capacitance of one or both of the variable capacitors 118, 120 so that the antenna and transceiver impedances match or at least come closer to matching than before the capacitance(s) were adjusted. In this way, efficiency is improved over the impedance mismatch situation created by environmental or positional changes with respect to the antenna 100 or the electronic device containing the antenna 100.

Figure 2:
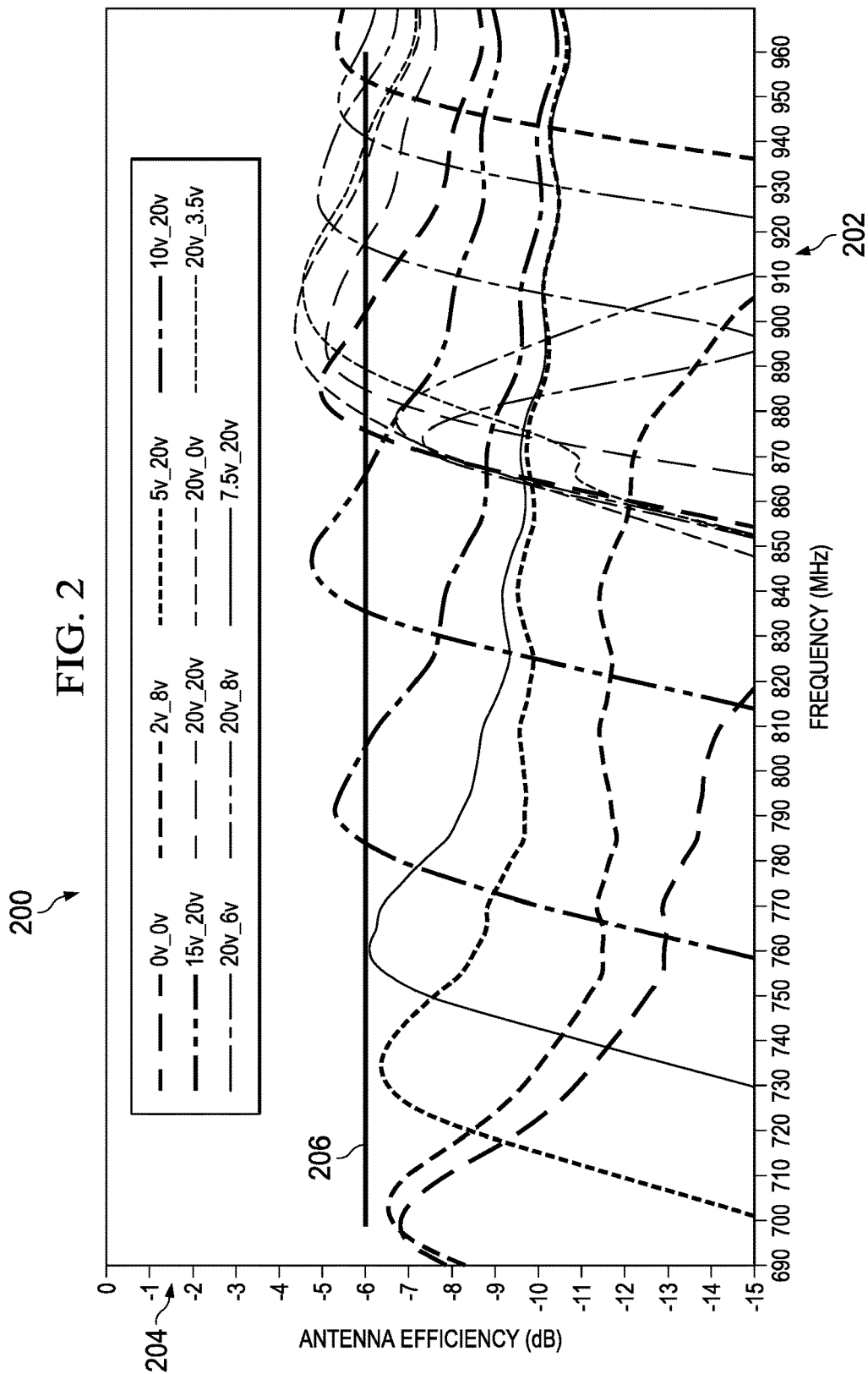
FIG. 2 is a graph illustrating efficiency in a dual resonance antenna as a function of operating frequency.

In addition, even if there is no impedance mismatch like the type described above, the capacitances of the variable capacitors 118, 120 may be dynamically adjusted to change the frequencies at which the device most efficiently operates. FIG. 2 is a graph 200 illustrating antenna efficiency in a dual resonance antenna across the 690-960 MHz frequency spectrum. The horizontal axis 202 depicts the operating frequency in MHz of the electronic device containing two illustrative, variable capacitors in accordance with embodiments of the invention. The vertical axis 204 indicates antenna efficiency in decibels (dB). Applying 2V to one of the two illustrative, variable capacitors produces an efficiency peak at approximately 703 MHz, and applying 8V to the other of the two variable capacitors produces a second efficiency peak at approximately 960 MHz. As the graph illustrates, altering the voltages applied to one or both of the variable capacitors independently shifts the efficiency peaks to differing frequency values. Thus, if a smartphone is operating at 900 MHz and 1800 MHz and it determines that it has new target operating frequencies of 703 MHz and 960 MHz (e.g., due to a change in location or some other reason), components such as that described with respect to FIG. 4 below apply 2V and 8V to the variable capacitors, thus improving impedance matching between the antenna and the transceiver when operating at 703 MHz and 960 MHz and thus improving efficiency when operating at those target frequencies. Control signals applied to the variable capacitors may be varied to shift the efficiency peaks as desired—for example, in some situations, the variable capacitors may be adjusted so that the frequencies at which operation is most efficient are adjacent and thus form a continuous, wide frequency band. The graph 200 is merely illustrative of the operation of one or some antennas, and the scope of disclosure is not limited to any particular electronic device and/or antenna configuration that results in any particular frequency-efficiency curve(s). In addition, graph 200 shows a bar 206 that marks an ideal efficiency level for operation in at least some circumstances, but in some cases acceptable efficiency levels may be below this bar.

Figure 3:
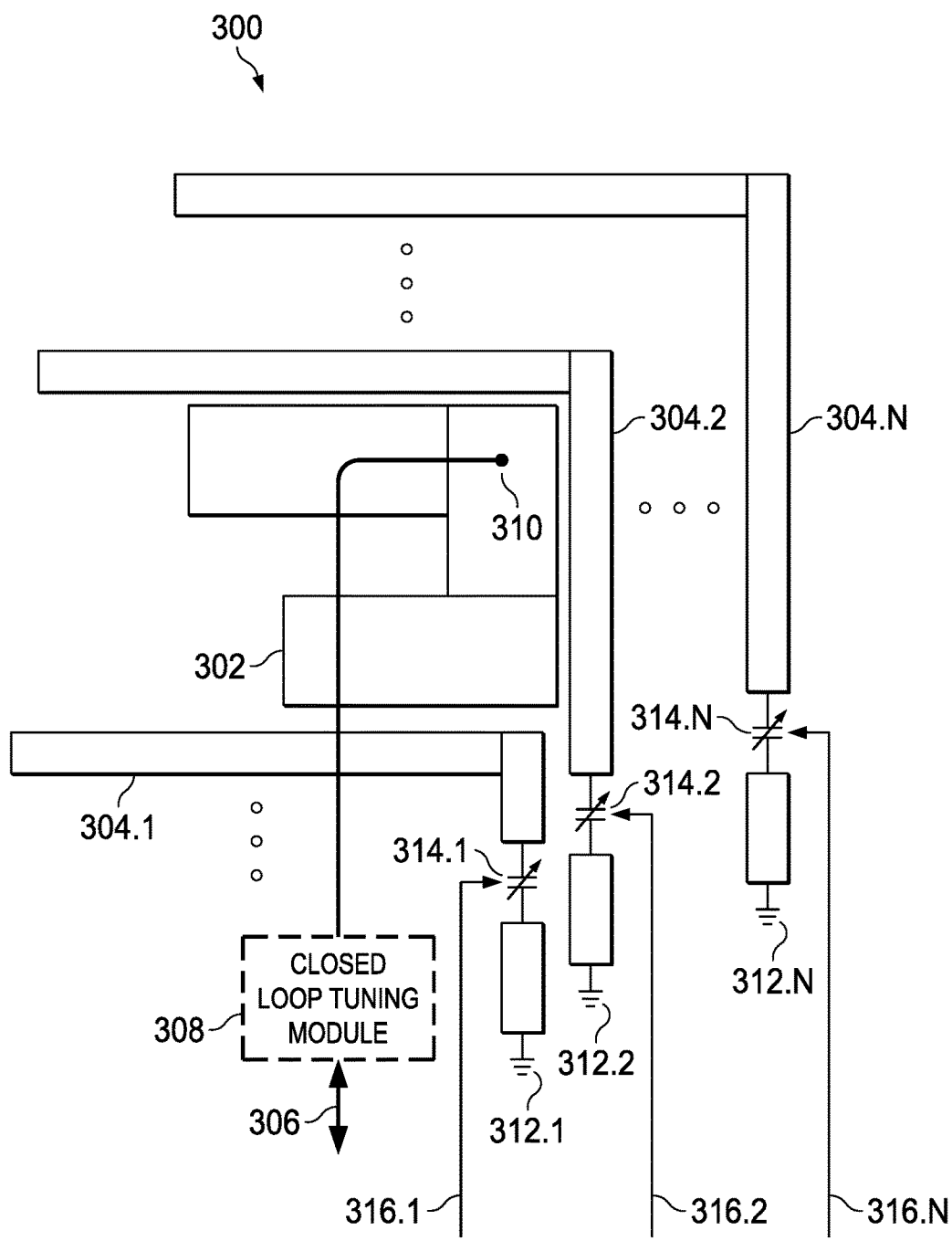
FIG. 3 is a block diagram of a generic, multi-resonance antenna in accordance with embodiments of the invention.

FIG. 3 is a block diagram of a multi-resonance antenna 300 in accordance with embodiments of the invention. The antenna 300 is a more generic representation of the antenna 100 shown in FIG. 1. The antenna 300 comprises a central element 302; coupling elements 304.1, 304.2, ..., 304.N; a microcoax cable 306; a closed loop tuning module 308; a feed point 310; ground connections 312.1, 312.2, ..., 312.N; variable capacitors 314.1, 314.2, ..., 314.N; and control signal connections 316.1, 316.2, ..., 316.N that control the variable capacitors. In some embodiments, one or more of the coupling elements may connect to multiple variable capacitors. The operation of the antenna 300 is similar to that of antenna 100 and thus is not repeated here. The closed loop tuning module 308, which is not specifically illustrated in the antenna 100, operates to identify impedance mismatches between the antenna 300 and a transceiver connected to the microcoax cable 306. The module 308 may contain, for instance, an integrated coupler and sense integrated circuit to detect such impedance mismatches on the cable 306.

Figure 4:
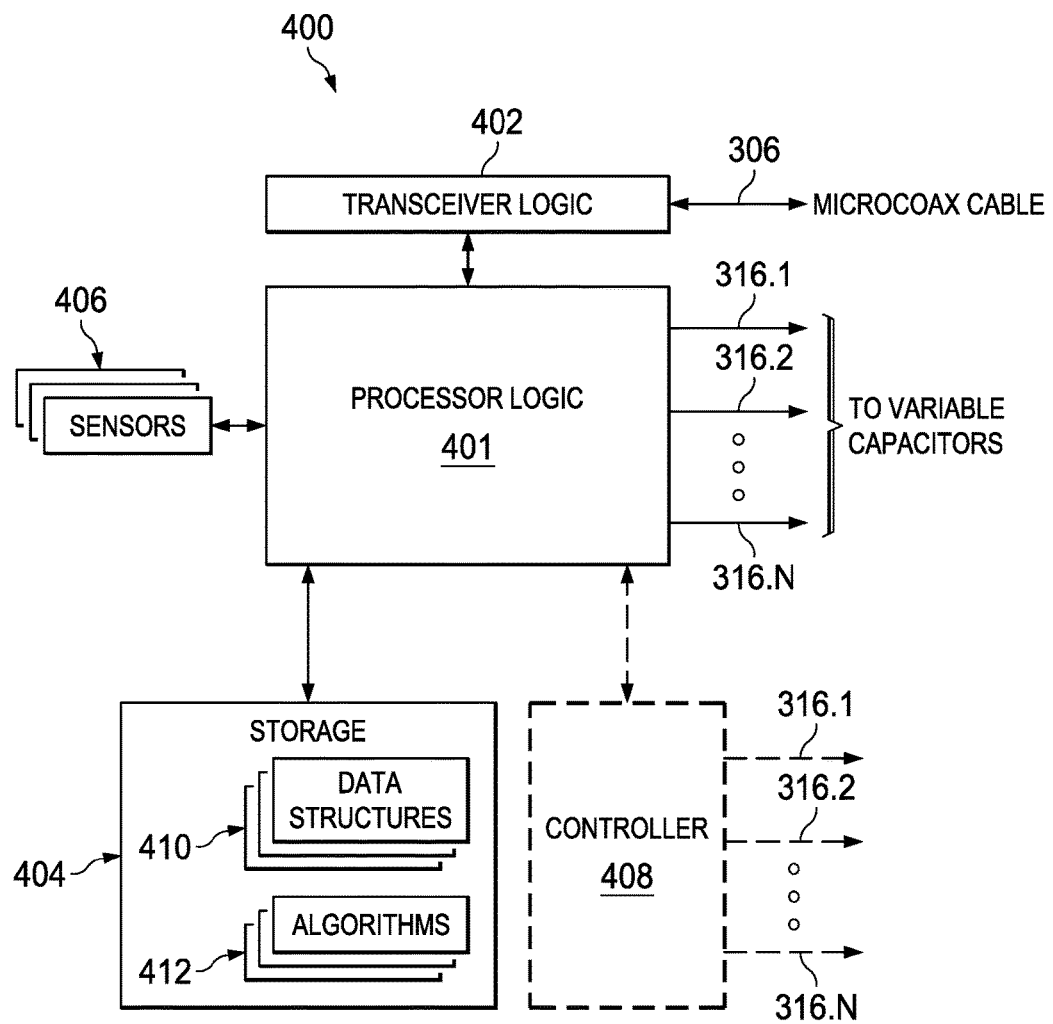
FIG. 4 is a block diagram of components usable to drive antennas in accordance with embodiments of the invention.

FIG. 4 is a block diagram of components 400 usable to drive antennas (e.g., antennas 100, 300) in accordance with embodiments of the invention. The components 400 may be incorporated into the same electronic device as the antenna that it drives, although the scope of disclosure is not limited as such. The components 400 include a processor 401; a transceiver 402 that connects to the processor 401; storage 404 (e.g., permanent or temporary; may include, for instance, hard drives, thumb drives, optical storage, ROM, RAM, remote or distributed memory; cloud via a network connection, etc.); sensors 406 (e.g., to detect rotation of the electronic device containing the components 400; to detect position of the device relative to a body or body part); microcoax cable 306 (i.e., from FIG. 3); optional controller 408 (e.g., a dedicated, integrated circuit for controlling one or more variable capacitors); and control signal connections 316.1, 316.2, ..., 316.N, which connect to and control the variable capacitors described above.

In operation, signals to be transmitted via the disclosed antenna (e.g., antenna 100, 300) are generated by the processor 401 and prepared for transmission (e.g., modulation) by transceiver 402. The modulated signal is then sent to the antenna via the microcoax cable 306. Received signals are processed and demodulated by the transceiver 402 and the resulting electrical signal is provided to the processor 401. The storage 404 includes one or more data structures 410 and one or more algorithms (e.g., software) 412. At least one of the data structures 410 cross-references multiple possible target operating frequencies with multiple possible control signals (e.g., voltages) that may be applied to one or more variable capacitors on the antenna via connections 316.1, 316.2, ..., 316.N. The reasons that an electronic device would shift to different operating frequencies is beyond the scope of this disclosure, but if such a decision is made, the data structure may be used to determine the optimal control signals to apply to one or more of the variable capacitors to minimize impedance mismatching, thus improving operational efficiency. In at least some embodiments, such a data structure 410 is pre-programmed by an engineer or designer.

At least one of the data structures 410 cross-references multiple possible operating conditions (e.g., position of electronic device containing antenna and components 400) with multiple possible control signals that may be applied to one or more variable capacitors on the antenna. Thus, upon receiving data regarding such operating conditions from one or more sensors 406, the processor 401 may use such a data structure to determine the capacitance(s) on one or more of the variable capacitors that would minimize impedance mismatch, thus improving operational efficiency. In at least some embodiments, such a data structure 410 is pre-programmed by an engineer or designer.

At least one of the algorithms 412 contains code, executable by processor 401, that instructs the processor 401 regarding how to adjust the control signals applied to one or more of the variable capacitors in the event that the closed loop tuning module 308 (FIG. 3) detects an impedance mismatch. Such code is application-specific and may be designed as suitable, but it should aim to minimize impedance mismatching detected by the closed loop tuning module 308. The code may be programmed by an engineer or designer.

In some embodiments, one or more of the actions performed by the processor 401 as described above may instead be performed by an optional, dedicated controller 408. For instance and without limitation, the controller 408 may be responsible for communicating with one or more of the variable capacitors. In some embodiments, the controller 408 may itself be controlled by, or may operate in coordination with, the processor 401.

Figure 5A:
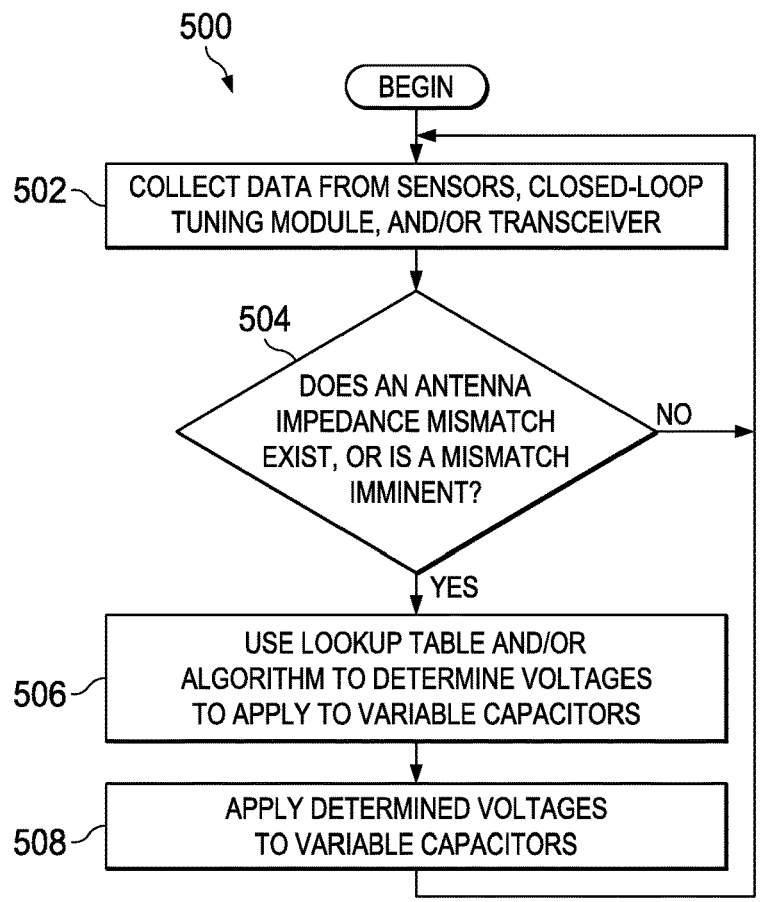
FIG. 5A is a flow diagram of a method in accordance with embodiments of the invention.

FIG. 5A is a flow diagram of a method 500 in accordance with embodiments of the invention. The method 500 begins with the processor collecting data from the sensor(s), closed-loop tuning module, and/or the transceiver (step 502). As previously explained, such data may include, without limitation, information about operating conditions (e.g., position of electronic device or proximity to body parts) and/or an impedance mismatch indication. The method 500 next comprises using the received data to determine whether an impedance mismatch exists between the antenna and transceiver or if a mismatch is imminent (e.g., due to changing operating conditions) (step 504). In the case of data from the closed-loop tuning module (e.g., module 308 in FIG. 3), the existence of an impedance mismatch is already evident. In the case of data from sensors, a data structure 410 (FIG. 4) is used to determine whether impedance adjustments are necessary. The method 500 then comprises using a lookup table (e.g., a data structure 410) and/or an algorithm (e.g., an algorithm 412) to identify the control signal(s) that should be applied to the variable capacitor(s) (step 506). Finally, the method 500 includes applying the control signal(s) to one or more of the variable capacitors (step 508). Because impedance matches are continuously monitored, control of the method 500 then returns to step 502.

Figure 5B:
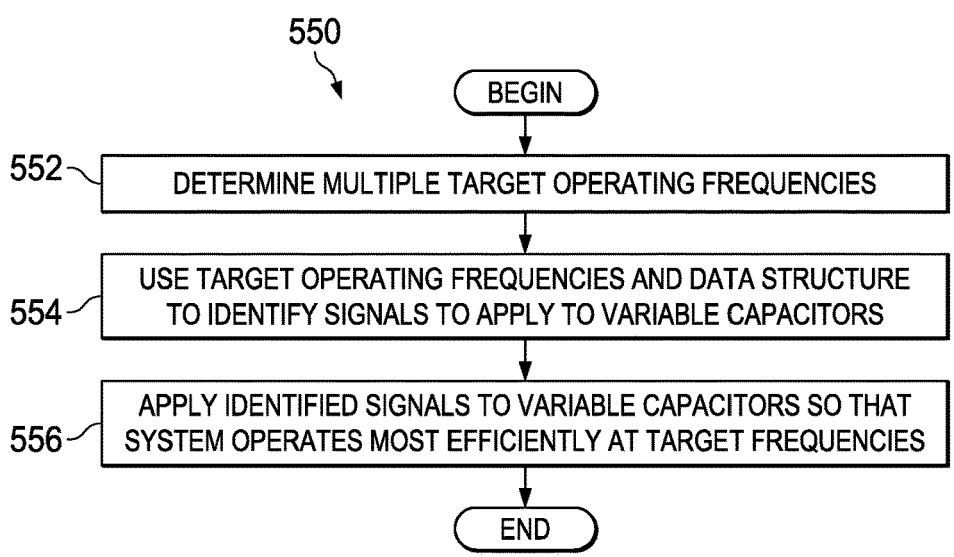
FIG. 5B is a flow diagram of another method in accordance with embodiments of the invention.

FIG. 5B is a flow diagram of a method 550 in accordance with embodiments of the invention. Unlike the method 500, which is tailored to detecting impedance mismatch, the method 550 is typically used to ensure impedance matching when one or more of the operating frequencies of the electronic device are to be adjusted. In this way, impedance mismatches are ameliorated and efficiency is sustained or improved despite changes in the device's operating frequencies. The method 550 begins by determining the multiple target operating frequencies at which the electronic device is to operate (step 552). Lookup tables (e.g., one or more data structures 410) are used to determine the control signal(s) that correspond to the target operating frequencies (step 554). The control signal(s) are then applied to the variable capacitors so that the electronic device operates most efficiently at the target operating frequencies. The steps of methods 500 and 550 may be adjusted as desired, including the addition, deletion and/or rearrangement of one or more steps.

Numerous other variations and modifications will become apparent to those skilled in the art once the above disclosure The following is claimed:

1. A system, comprising:
   a processor;
   a transceiver coupled to the processor; and
   an antenna including a central element that connects to one or more of the processor and the transceiver, said antenna further including multiple coupling elements that electromagnetically couple directly to the central element,
   wherein each of the multiple coupling elements comprises a separate variable capacitor,
   wherein the central element includes a first portion having a first length direction and a second portion having a second length direction, the first length direction extending alongside the second length direction, and a third potion having a length direction that intersects the first length direction and the second length direction;
   wherein a first of the multiple coupling elements is arranged in the antenna adjacent to the first and third portions of the central element, and
   wherein a second of the multiple coupling elements is arranged in the antenna adjacent to at least the second portion of the central element.

2. The system of claim 1, wherein a change in the capacitances of the variable capacitors causes a shift in the frequencies at which the system operates most efficiently.

3. The system of claim 1, wherein at least one of the multiple coupling elements comprises a ground connection positioned within one centimeter of at least one of said variable capacitors.

4. The system of claim 1, wherein said separate variable capacitors are controlled by control signals supplied by the processor.

5. The system of claim 1, wherein a capacitance range of at least one of said variable capacitors is 2.05 pico Farads to 8.2 pico Farads.

6. The system of claim 1, wherein a control signal applied to at least one of said variable capacitors is determined based on a target operating frequency for the system.

7. The system of claim 6, further comprising a data structure that cross-references multiple possible target operating frequencies for the system with multiple possible control signals that can be applied to one or more of the variable capacitors.

8. The system of claim 1, wherein a control signal applied to at least one of said variable capacitors is determined based on a mismatch between an antenna impedance and an impedance associated with said transceiver.

9. The system of claim 8, wherein said mismatch is detected using one or more sensors that sense environmental or positional changes associated with the system.

10. The system of claim 9, wherein the processor uses a data structure that cross-references possible data from said one or more sensors with possible control signals that can be applied to the separate variable capacitors.

11. The system of claim 8, further comprising a closed loop tuning module that detects said mismatch, wherein the processor uses data from the closed loop tuning module to determine said control signal to correct said mismatch.

12. The system of claim 1, wherein the multiple coupling elements do not directly connect with the central element or with each other.

13. The system of claim 1, wherein each of the multiple coupling elements comprises multiple variable capacitors.

14. The system of claim 1 wherein the first length direction is parallel to the second length direction, and the third length direction is perpendicular to the first length direction.

15. An antenna, comprising:
   a central element that receives signals from and provides signals to a transceiver;
   multiple coupling elements that electromagnetically couple directly with the central element; and
   multiple variable capacitors, each of said capacitors positioned on a different one of the multiple coupling elements
   wherein the central element includes a first portion having a first side and a second portion having a second side that do not meet, and a third potion having a third side that intersects both the first side and second side;
   wherein a first of the multiple coupling elements is arranged in the antenna adjacent to the first and third sides of the central element, and
   wherein a second of the multiple coupling elements is arranged in the antenna adjacent to at least the second side of the central element.

16. The antenna of claim 15, wherein each of the multiple coupling elements has a ground connection, and wherein each of said ground connections is positioned between one millimeter and one centimeter away from the variable capacitor on that coupling element.

17. The antenna of claim 15, wherein the multiple coupling elements do not connect directly with the central element.

18. The antenna of claim 15, wherein the multiple coupling elements are separated from each other at all points by a minimum distance that ranges from one millimeter to one centimeter, inclusive.

19. The antenna of claim 15 wherein the first side is parallel to the second side, and the third side is perpendicular to the first and second sides.

20. A method, comprising:
   determining multiple target operating frequencies in an antenna;
   identifying, based on the multiple target operating frequencies, control signals to apply to multiple variable capacitors built into coupling elements of said antenna; and
   applying the control signals to the multiple variable capacitors so that said multiple target operating frequencies are the frequencies at which the antenna operates most efficiently,
   wherein the antenna includes a central element having a first portion having a first length direction and a second portion having a second length direction arranged alongside the first length direction, and a third potion having a third length direction that intersects both the first and second length directions;
   wherein a first of the coupling elements is arranged in the antenna adjacent to the first and third portions of the central element, and
   wherein a second of the coupling elements is arranged in the antenna adjacent to at least the second portion of the central element.

21. The method of claim 20, further comprising using data structures that cross-reference multiple possible target operating frequencies with multiple possible control signals to identify said control signals to apply to the multiple variable capacitors.

22. The method of claim 20, further comprising applying said control signals to the multiple variable capacitors so that said frequencies at which the antenna operates most efficiently form a continuous frequency band.

23. The method of claim 20 wherein the first length direction is parallel to the second length direction, and the third length direction is perpendicular to the first length direction.

* * * * *